United States Patent [19]
Fossum

[11] Patent Number: 6,005,619
[45] Date of Patent: Dec. 21, 1999

[54] QUANTUM EFFICIENCY IMPROVEMENTS IN ACTIVE PIXEL SENSORS

[75] Inventor: Eric R. Fossum, LaCrescenta, Calif.

[73] Assignee: Photobit Corporation, Pasadena, Calif.

[21] Appl. No.: 08/944,794

[22] Filed: Oct. 6, 1997

[51] Int. Cl.[6] .................................................. H04N 3/14
[52] U.S. Cl. ......................... 348/315; 348/297; 348/308
[58] Field of Search .................................. 348/297, 298, 348/308, 309, 310, 306, 315; 257/233, 291, 292

[56] References Cited

U.S. PATENT DOCUMENTS

| | | | |
|---|---|---|---|
| 4,463,383 | 7/1984 | Soneda et al. | 358/212 |
| 5,285,091 | 2/1994 | Hamasaki | 257/292 |
| 5,303,074 | 4/1994 | Salisbury | 359/59 |
| 5,327,004 | 7/1994 | Kurusu et al. | 257/435 |
| 5,471,515 | 11/1995 | Fossum et al. | 377/60 |
| 5,629,517 | 5/1997 | Jackson et al. | 250/208.1 |
| 5,665,959 | 9/1997 | Fossum et al. | 250/208.1 |
| 5,841,126 | 11/1998 | Fossum et al. | 250/208.1 |
| 5,841,158 | 11/1998 | Merrill | 257/233 |

OTHER PUBLICATIONS

Mendis, Kemey, Gee, Pain, Kim & Fossum, Progress in CMOS Active Pixel Image Sensors, Presented Feb. 7–8, 1994, SPIE vol. 2172, pp. 19–29.

Yadid–Pecht, Mansoorian, Fossum & Pain, Optimization of Noise and Responsibility in CMOS Active Pixel Sensors for Detection of Ultra Low Light Levels, Presented Feb. 10–11, 1997, SPIE vol. 3019, pp. 125–136.

*Primary Examiner*—Wendy Garber
*Assistant Examiner*—Jacqueline Wilson
*Attorney, Agent, or Firm*—Fish & Richardson P.C.

[57] ABSTRACT

Quantum efficiency in an active pixel sensor improved by proper sizing and shaping of the contacts. The photodiode elements are formed of special shapes that are optimized for obtaining diffusion of charge, rather than obtaining the charge directly. Photogates are formed with a thinned polysilicon covering.

36 Claims, 8 Drawing Sheets

Open vs. Masked Pixel Response

Pixel Layouts

6,005,619

QUANTUM EFFICIENCY IMPROVEMENTS IN ACTIVE PIXEL SENSORS

BACKGROUND OF THE INVENTION

The present invention describes to a technique of optimizing quantum efficiency in a CMOS image sensor, specifically an active pixel sensor.

Electronic image sensors obtain an electrical image of a subject. The sensor converts the incoming light photons to an electronic signal (electrons). The efficiency of conversion between the photons and electrons is often called quantum efficiency ("QE"). QE is one of the key imaging performance benchmarks of sensors.

CCD type light sensors store charge in an array formed on a substrate. Each portion of the array stores a picture element, or "pixel" of the overall image.

Sensors formed of complementary metal oxides semiconductor ("CMOS") include associated circuitry within the pixel. That associated circuit portion is not light sensitive. Those areas which do not collect light include the associated circuitry which operates to convert the information stored in the pixel into an electronic signal. These non-photosensitive areas include, but are not limited to, routing buses, transistors, and areas covered by opaque materials such as silicides.

Many image sensor devices convert the incoming photons to charge using a photogate. That charge is stored in the substrate. Other devices convert the incoming photons to electrons using a photodiode. However, the photodiode must therefore receive the photons in order to convert them. Therefore, it has been the understanding of those of ordinary skill in the art that the non-light sensitive areas would reduce the overall quantum efficiency of the device and hence, the overall light sensitivity of the device. Therefore, those having ordinary skill in the art have tried to minimize the amount of the pixel area which was used for associated circuitry, in order to maximize the photosensitive area. This was done by, for example, enlarging the size of the photodiode to maximize the amount of light received thereby.

Another common trend in the art has been to use a combination of polysilicon and metal to reduce the resistance of electricity. The polysilicon and metal combination is often called a polycide. Specific materials include silicides and salacides. Many modern sub-micron processes use these materials in order to reduce the resistance. However, these materials are also opaque.

Diodes, including the photodiodes which can be used in active pixel sensors, can be formed of such a polycide. However, to the knowledge of the inventors, no one has suggested doing so, since the photodiode formed of polycide would be opaque and therefore would not be expected to receive information from the incoming light.

A basic active pixel sensor is shown in U.S. Pat. No. 5,471,515, the disclosure of which is herewith incorporated by reference.

SUMMARY OF THE INVENTION

The present invention describes a technique that improves quantum efficiency in a CMOS sensor. This is done according to the present invention using different techniques. A first technique describes improving the QE in a photodiode pixel by reducing, rather than increasing, the amount of photosensitive area in the pixel.

A second technique describes improving the QE response of a photogate structure.

An aspect of the present invention involves making the photodiode smaller, instead of larger as was suggested by the prior art. This is done by using the inventor's understanding of a new technique of operation. Photons are captured in the substrate of the photodiode and are converted to electron-hole pairs. These electron-hole pairs diffuse into the diode to form current. The diode size according to this embodiment is optimized for obtaining diffusion from the substrate, rather than for obtaining the light directly. This requires that the diode be smaller than the overall open area in the substrate.

Another aspect of the present invention includes the special shapes for these photodiodes which reduce their capacitance and further increase their gain.

Another aspect of the present invention is using a thinned polysilicon layer overlying a photogate structure. This thinned polysilicon layer avoids certain photon attenuation.

DESCRIPTION OF THE PREFERRED EMBODIMENTS

Figure 1:
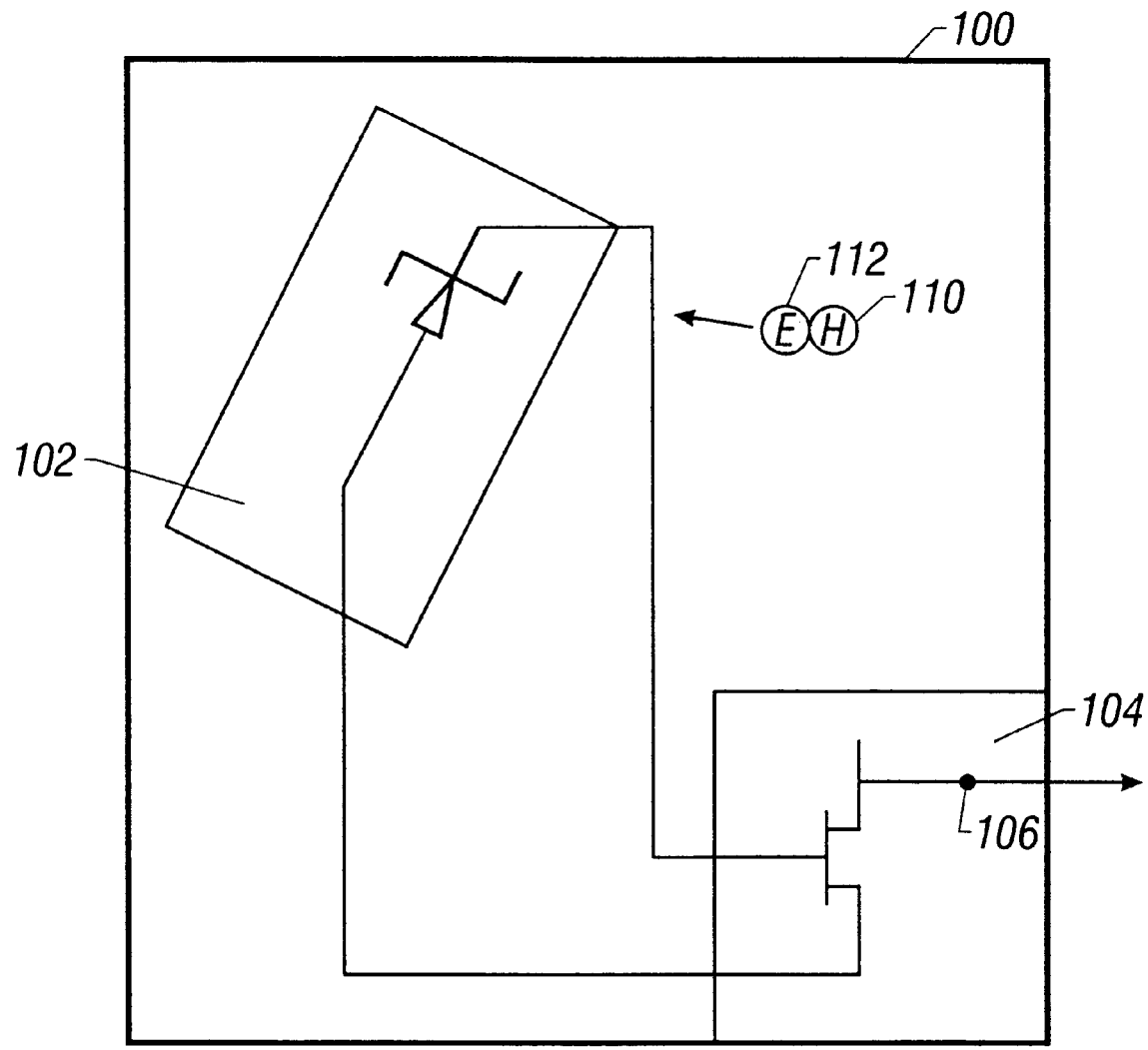
FIG. 1 shows an active pixel sensor using a photodiode device.

FIG. 1 shows a schematic representation of a photodiode pixel. Each pixel 100 includes a photodiode area 102 and associated circuitry area 104. The device shown in FIG. 1 is an "active pixel" which means that each pixel includes at least some circuitry associated with the pixel and actually formed within the pixel. Circuitry 104 is shown schematically as including a source follower, but it should be understood that other associated circuitry can also be integrated in the pixel. That associated circuitry is preferably formed of NMOS or CMOS. NMOS is preferred since CMOS circuits would be larger in size. No specialized semiconductor formation techniques are required to form either NMOS or CMOS, such as those required with charge coupled devices ("CCD's"). More details about this are found in U.S. Pat. No. 5,471,515.

The photodiode element 102 is also shown in FIG. 1. Photodiode 102 is formed of a CMOS-compatible process, such as CMOS or NMOS. FIG. 1 shows a system according to the present invention whereby the size of the photodiode 102 is smaller than the total area within the pixel which is available for such a photodiode.

The established teaching in the art of image sensors and especially active pixel sensors has been that the photodiode pixel should have a photon collecting area which is as large as possible. Conventional photodiode pixels have formed the photodiode in the shape of a solid polygon such as a square, rectangle, or L-shaped photodiode area. For example, in the exemplary pixel layout shown in FIG. 1, the photodiode would have had the L-shaped area shown in everything except conversion circuitry 104.

The source follower in an active pixel sensor converts the accumulated charge from the photodiode into a voltage. The inventors recognized that the voltage at node 106 is a voltage V which is proportional to Q (charge) divided by C (capacitance). The inventors found, unexpectedly, that the conversion gain, expressed in terms of volts (microvolts) per electron can unexpectedly be increased by reducing the diode size since it reduces the capacitance more than the associated reduction in charge. This effectively reduced the amount of the circuit which is used for the diode as shown in FIG. 1, but increased the light sensitivity.

The inventors postulate the reason for this being that photons create an electron-hole pair such as 110. The inventors believe that the electron-hole pair 110 in the unoccupied part of the substrate 112 diffuses into photodiode 102.

The inventors realized that this system can be used to maintain the electron-hole pair diffusing into the photodiode 102 instead of diffusing deeper into the substrate. In the latter case, the electron-hole pair would be lost.

The shape of the photodiode is preferably optimized for obtaining diffusion from the substrate, rather than for obtaining the light directly. The systems shown in the FIGS. represent the different layouts that the inventors have found to be useful.

Figure 2:
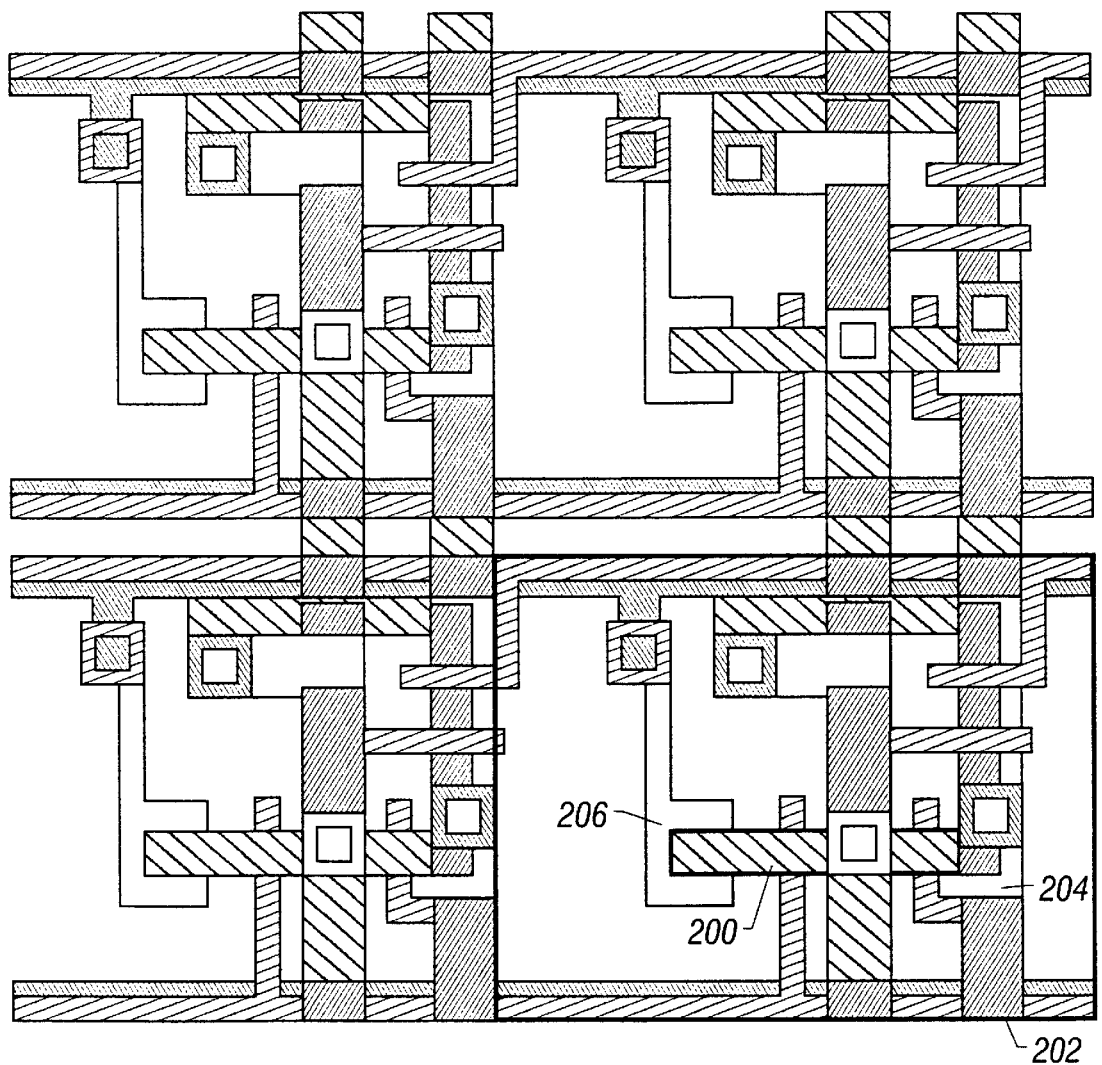
FIGS. 2–6 show different possible shapes for the photodiodes.

FIG. 2 shows a first layout of a photodiode arrangement according to this embodiment. The photodiode 200 in FIG. 2 is shown within the pixel generally referred to by the rectangular outline 202. Photodiode 200, therefore, is formed of a substantially rectangular area which substantially extends from an edge 204 of the pixel to a central portion 206 of the pixel. The photodiode 200 is formed only along that line leaving the remainder of the pixel substantially open.

Figure 3:
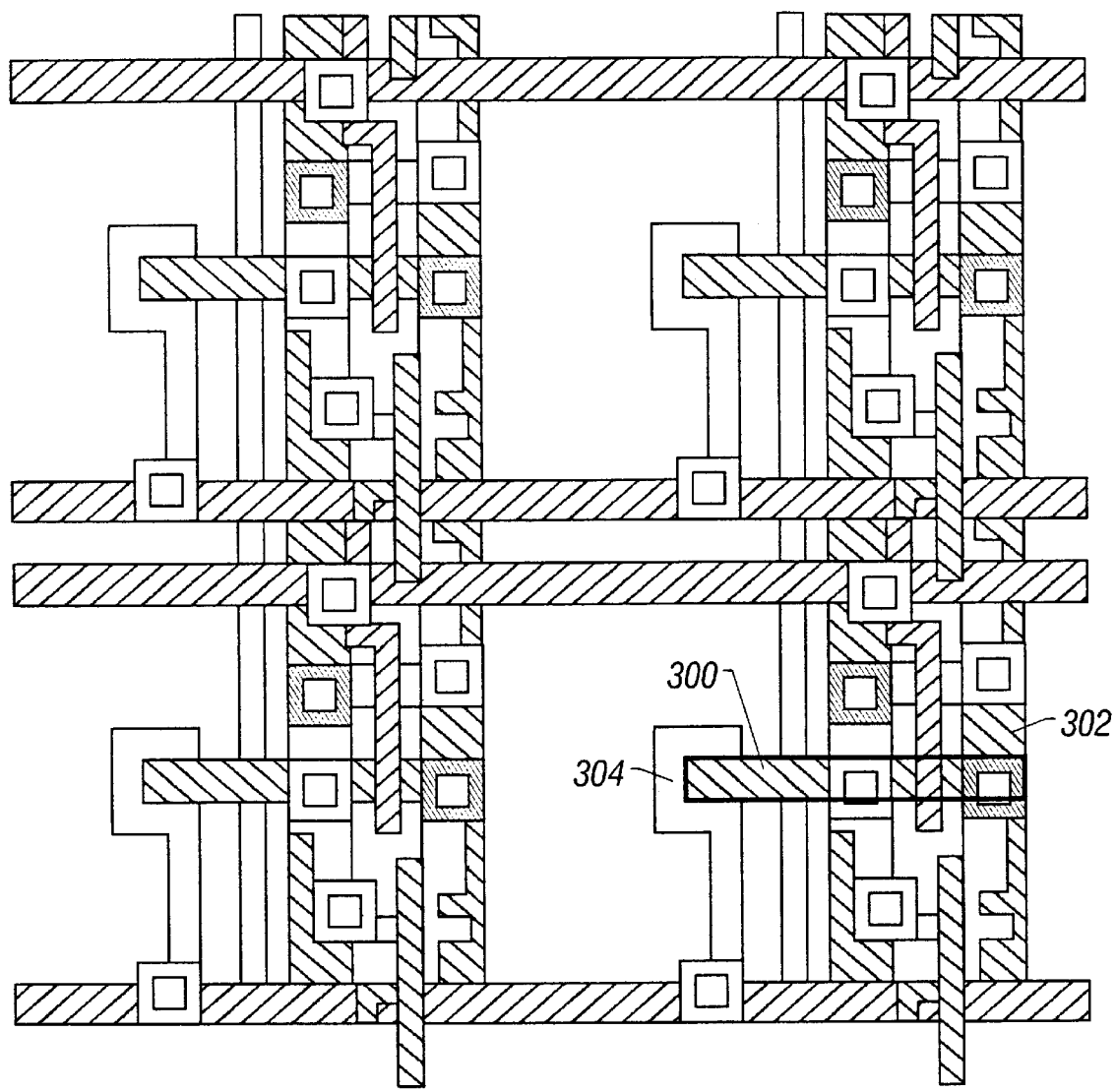

FIG. 3 shows another embodiment in which the photodiode 300 again extends from the edge of the pixel 302 towards the central portion of the pixel 304.

Figure 4:
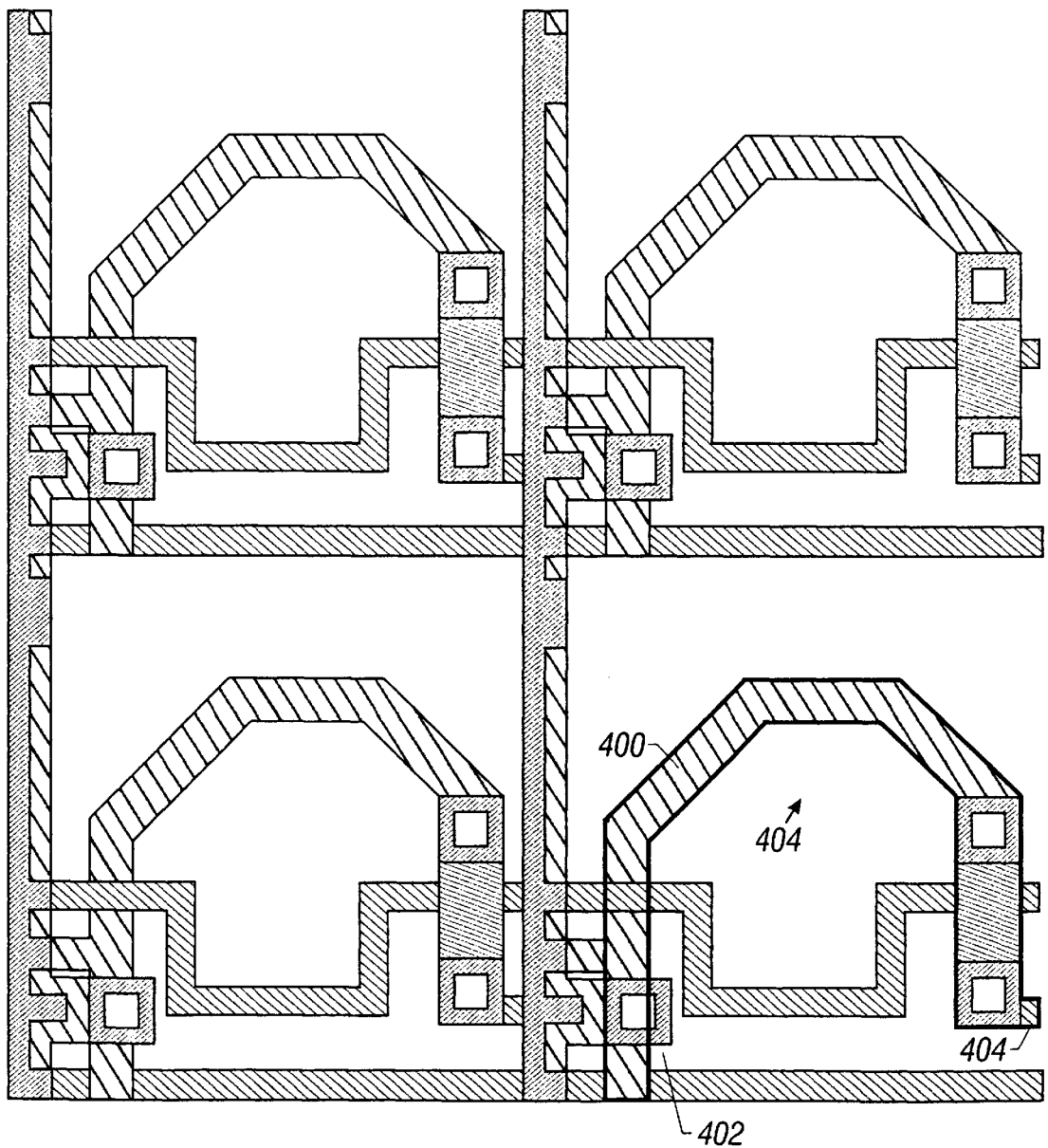

FIG. 4 shows a partial-ring-shaped photodiode. Photodiode 400 extends from a point 400 to near one edge of the pixel to a point 404 near another end of the pixel. Photodiode 400 follows a substantially arc-shaped route which takes it around a central centroid portion 404 of the pixel.

Figure 5:
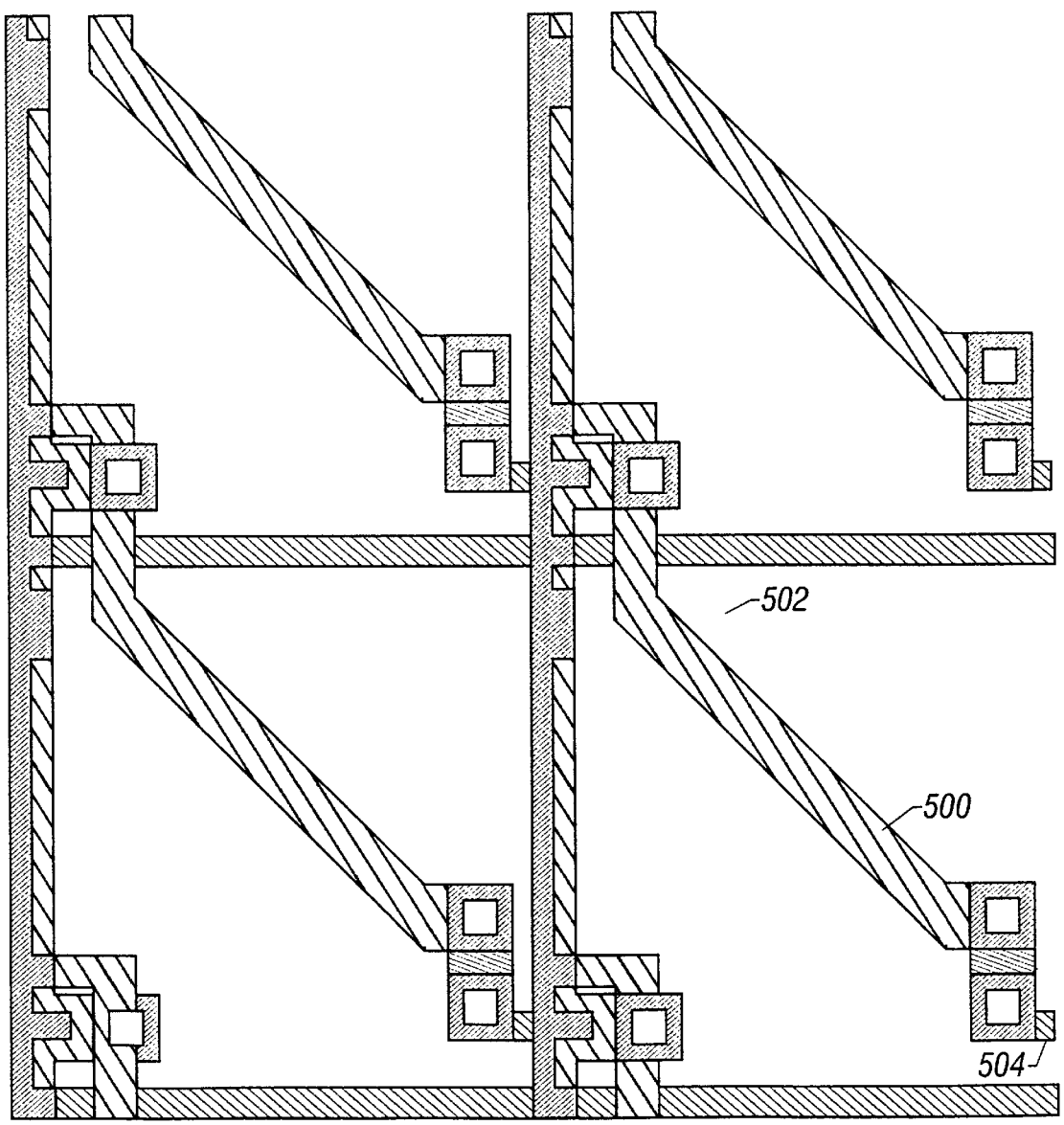

FIG. 5 shows a system with a photodiode 500 forming a diagonal across the pixel extending from one edge 502 of the pixel to an opposite edge 504 of the pixel.

Figure 6:
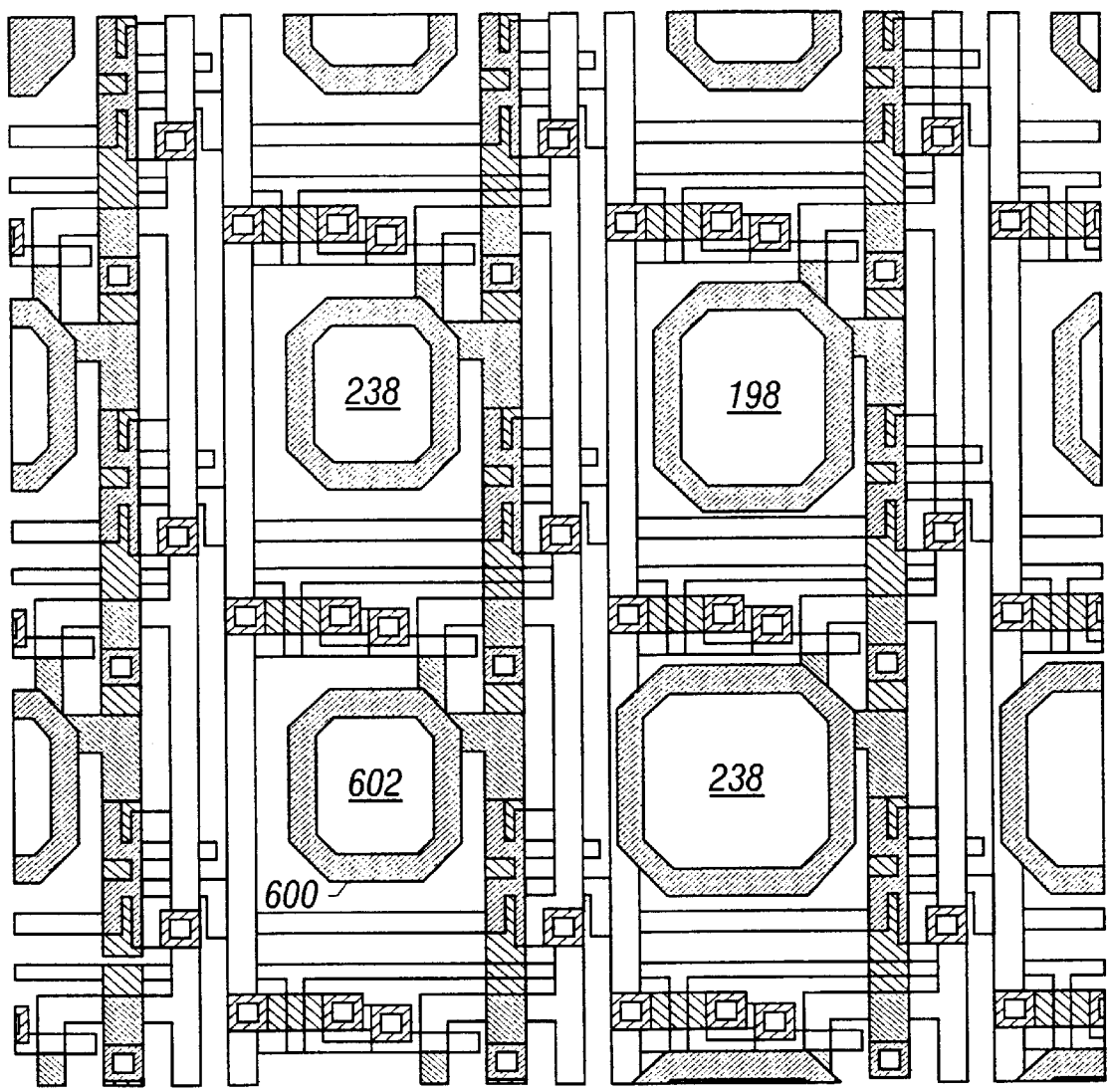

FIG. 6 shows a system where each pixel includes a ring-shaped photodiode 600. Photodiode 600 forms a shape that surrounds a central point 602. The inventors believe that this shape is especially advantageous since it allows photons to be collected from both the inside and the outside of the ring shape.

All of these shapes are optimized to accumulate the electron hole pairs which have formed in the substrate.

Figure 7A:
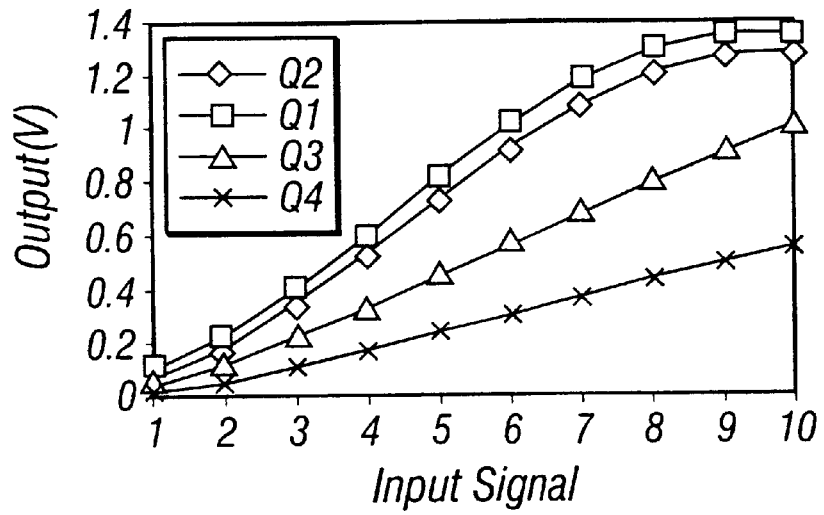
FIG. 7 shows and exemplary response of active pixel sensor.
Figure 7B:
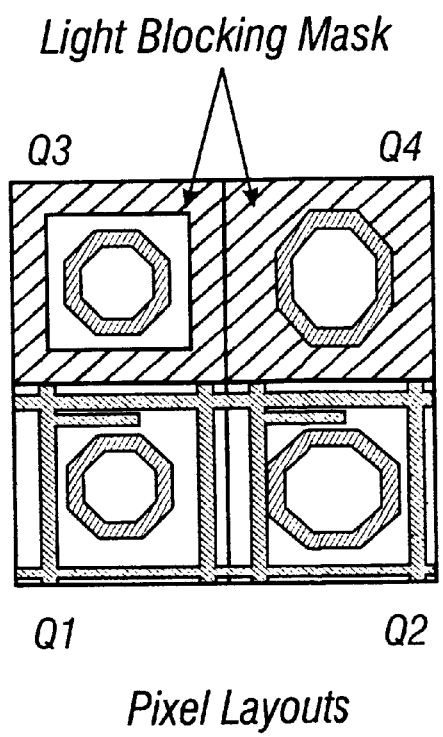

Another possibility is the use of masking over the pixels to even further block light from accumulating. FIG. 7A shows the various pixel layouts, and FIG. 7B shows the results of the masking.

Figure 8:
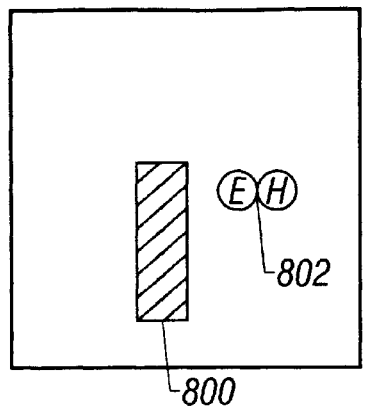
FIG. 8 shows a photodiode formed of polycides.

Yet another alternative is that any of the embodiments shown in any of FIGS. 1 through 7A could have photodiodes formed of polycide, as shown generically in FIG. 8. The polycide material blocks the light from impinging directly onto the photodiode. The light does not directly impinge on photodiode 800, but instead impinges on a portion of the substrate 802. No light is directly received by photodiode 800 since it is formed of a light blocking polycide. Light is only received in the adjoining substrate portions.

Figure 9:
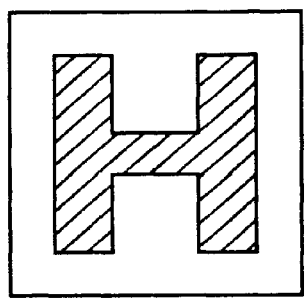
FIGS. 9 and 10 show two additional shapes for photodiodes of the present invention.
Figure 10:
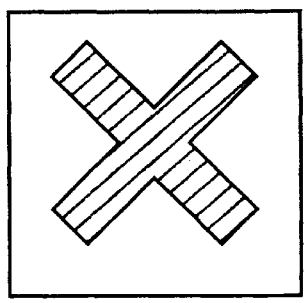

Other shapes which have been contemplated by the inventors include a "H"-shaped photodiode shown in FIG. 9 and a "X"-shaped photodiode shown in FIG. 10.

All of these shapes have in common the concept that the photodiode element should be physically located in a place which will collect a maximum amount of charge from many areas of the substrate.

Figure 11:
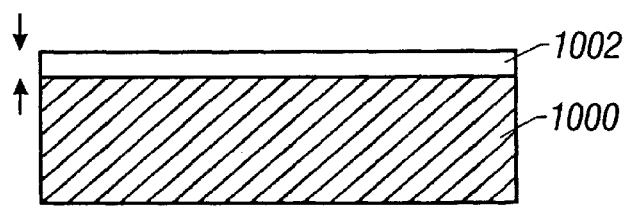
FIG. 11 shows a photogate device with a thin polysilicon overlayer.

FIG. 11 shows a second embodiment of the invention useable in a photogate-type device. FIG. 11 shows a charge collecting substrate 1000, with the polysilicon gate 1002 over the substrate 1000. According to this embodiment, the polysilicon gate 1002 is made thinner than has been done in the past. While a usual polysilicon gate is usually as thin as 1000 angstroms, the gate of the photogate APS of FIG. 11 is thinned down to between 300 and 400 angstroms.

Polysilicon has been found to attenuate incoming light, and especially blue components of the incoming light. This thinning allows improvement of this aspect of light collection.

Other embodiments are within the disclosed invention.

What is claimed is:

1. An image sensor, comprising:

a plurality of pixel areas, each pixel area including a circuitry area and a photodiode area, said photodiode area including a photodiode element therein, said photodiode element taking less than an entire amount of space left open by the circuitry area, wherein said photodiode element is located in a position on said substrate which includes a plurality of collection areas in said substrate which are substantially equidistant from said photodiode element, wherein said photodiode is in the shape of a bar extending from an edge of the pixel towards a center of the pixel.

2. An image sensor, comprising:

a plurality of pixel areas, each pixel area including a circuitry area and a photodiode area, said photodiode area including a photodiode element therein, said photodiode element taking less than an entire amount of space left open by the circuitry area, wherein said photodiode element is located in a position on said substrate which includes a plurality of collection areas in said substrate which are substantially equidistant from said photodiode element, wherein said photodiode is in the shape of only a portion of a ring.

3. An image sensor, comprising:

a plurality of pixel areas, each pixel area including a circuitry area and a photodiode area, said photodiode area including a photodiode element therein, said photodiode element taking less than an entire amount of space left open by the circuitry area, wherein said photodiode element is located in a position on said substrate which includes a plurality of collection areas in said substrate which are substantially equidistant from said photodiode element, wherein said photodiode extends along a diagonal of said pixel.

4. An image sensor, comprising:

a plurality of pixel areas, each pixel area including a circuitry area and a photodiode area, said photodiode area including a photodiode element therein, said photodiode element taking less than an entire amount of space left open by the circuitry area, wherein said photodiode element is located in a position on said substrate which includes a plurality of collection areas in said substrate which are substantially equidistant from said photodiode element, wherein said photodiode is in the shape of an H.

5. An image sensor, comprising:

a plurality of pixel areas, each pixel area including a circuitry area and a photodiode area, said photodiode area including a photodiode element therein, said photodiode element taking less than an entire amount of space left open by the circuitry area, wherein said photodiode element is located in a position on said substrate which includes a plurality of collection areas in said substrate which are substantially equidistant from said photodiode element, wherein said photodiode is in the shape of an X.

6. An image sensor, comprising:

a plurality of pixel areas, each pixel area formed on a substrate of a type that can receive impinging light, and react to said impinging light to form a changed substrate portion that can diffuse, each said pixel area including a circuitry area and a photodiode area, said circuitry area including at least a buffer transistor therein and at least one circuit other than said buffer transistor, said buffer transistor and said at least one other circuit being formed of MOS, said photodiode area including a photodiode element therein, said photodiode element having a geometrical shape which is optimized for obtaining diffusion of said changed substrate portion, rather than for obtaining the light directly.

7. An image sensor as in claim 6, wherein said photodiode takes less than an entire amount of space left open by the circuitry area.

8. A sensor as in claim 7 wherein said photodiode is located in a position on said substrate which includes a plurality of collection areas in said substrate which are substantially equidistant from said photodiode.

9. A sensor as in claim 7 wherein said photodiode is in the shape of a bar extending from an edge of the pixel towards a center of the pixel ending near a center of said pixel.

10. A sensor as in claim 7 wherein said photodiode is in the shape of only a portion of a ring.

11. A sensor as in claim 7 wherein said photodiode extends along the diagonal of said pixel.

12. A sensor as in claim 7 wherein said photodiode is in the shape of a ring, a center of the ring being a center of the pixel.

13. A sensor as in claim 7 wherein said photodiode is in the shape of an H.

14. A sensor as in claim 7 wherein said photodiode is in the shape of an X.

15. An image sensor, comprising:

a plurality of pixel areas, each pixel area formed on a substrate of a type that can receive impinging light, each said pixel area including a circuitry area and a photodiode area, said photodiode area including a photodiode element therein said photodiode element itself formed of an opaque material that blocks light from directly reaching said photodiode element.

16. A sensor as in claim 15, wherein said opaque material is polycide.

17. An image sensor as in claim 15 wherein said photodiode element takes less than an entire amount of space left open by the circuitry area.

18. A sensor as in claim 15 wherein said photodiode is located in a position on said substrate which includes a plurality of collection areas in said substrate which are substantially equidistant from said photodiode.

19. A sensor as in claim 18 wherein said photodiode is in the shape of a bar extending from an edge of the pixel towards a center of the pixel.

20. A sensor as in claim 18 wherein said photodiode is in the shape of a portion of a ring.

21. A sensor as in claim 18 wherein said photodiode extends along the diagonal of said pixel.

22. A sensor as in claim 18 wherein said photodiode is in the shape of a ring, a center of the ring being a center of the pixel.

23. A sensor as in claim 18 wherein said photodiode is in the shape of an H.

24. An image sensor, comprising:

a plurality of pixel areas, each pixel area formed on a substrate of a type that can receive impinging light and react to said impinging light to form electron hole pairs, each said pixel area including a photodiode area, said photodiode area including a photodiode element therein, said photodiode element itself being formed of an opaque polycide, said photodiode element having a shape which is optimized for obtaining diffusion of said electron hole pairs, rather than for obtaining the light directly.

25. An image sensor, comprising:

a plurality of pixel areas, each pixel area formed on a substrate of a type that can receive impinging light, and react to said impinging light, each said pixel area including a circuitry area and a photogate area, said photogate area covered by a layer of polysilicon less than 400 Å in thickness.

26. An image sensor, comprising:

a plurality of pixel areas each pixel area including a circuitry area and a photodiode area, said photodiode area including a photodiode element therein, said photodiode element taking less than an entire amount of space left open by the circuitry area, wherein said photodiode element is located in a position on said substrate which includes a plurality of collection areas in said substrate which are substantially equidistant from said photodiode element, wherein said photodiode element is itself formed of an opaque material.

27. An image sensor as in claim 26, wherein said photodiode element is formed of polycide.

28. An image sensor as in claim 6, wherein said photodiode element is itself formed of an opaque material.

29. An image sensor as in claim 28, wherein said photodiode element is formed of polycide.

30. An image sensor, comprising:

a plurality of pixel areas, each pixel area formed on a substrate of a type that can receive impinging light, each said pixel area including a light receptor therein that is itself formed of an opaque material that blocks light from directly reaching said light receptor.

31. A method of forming an image sensor, comprising:

defining a plurality of pixel areas, each pixel area including a circuitry area for electronic circuitry including at least a buffer transistor and at least one circuit other than said buffer transistor, said buffer transistor and said at least one other circuit being formed of MOS, and an photosensitive area including a photosensitive element therein;

shaping said photosensitive element such that it takes less than an entire amount of space left open by the circuitry area;

forming a substrate of a type that can react to impinging radiation to form a changed substrate portion that can diffuse;

shaping said photosensitive element to a geometric shape that optimizes diffusing of said changed substrate portion; and allowing said changed portion to diffuse into said photosensitive element.

32. A method as in claim 30, wherein said photosensitive element is a photodiode.

33. A device as in claim 30, wherein said shaping comprises forming said photodiode into the shape of a bar extending from an edge of the pixel toward a center of the pixel and ending near a center of the pixel.

34. A method as in claim 30, wherein said shaping comprises shaping said photosensitive element into the portion of only a portion of a ring.

35. A method as in claim 30, further comprising shaping said photodiode to form a shaped photodiode along a diagonal of the pixel.

36. A method as in claim 30, further comprising shaping said photosensitive element into the shape of an H.

* * * * *

UNITED STATES PATENT AND TRADEMARK OFFICE
CERTIFICATE OF CORRECTION

PATENT NO. : 6,005,619
DATED : December 21, 1999
INVENTOR(S) : Eric R. Fossum, PH.D.

It is certified that error appears in the above-identified patent and that said Letters Patent is hereby corrected as shown below:

Column 7,
Line 6, delete "A method as in claim 30" and replace with -- A method as in claim 31 --.
Line 8, delete "A device as in claim 30" and replace with -- A device as in claim 31 --.

Column 8,
Line 1, delete "A method as in claim 30" and replace with -- A method as in claim 31 --.
Line 5, delete "A method as in claim 30" and replace with -- A method as in claim 31 --.
Line 8, delete "A method as in claim 30" and replace with -- A method as in claim 31 --.

Signed and Sealed this

Second Day of July, 2002

*Attest:*

*Attesting Officer*

JAMES E. ROGAN
*Director of the United States Patent and Trademark Office*